United States Patent [19]
Paun et al.

[11] Patent Number: 5,691,947
[45] Date of Patent: Nov. 25, 1997

[54] MULTIPLEXED PROGRAMMING VOLTAGE AND STATUS OVER SINGLE CONDUCTOR

[75] Inventors: Stefan Paun, Park Ridge; Robert E. Garon, Downers Grove, both of Ill.

[73] Assignee: Motorola Inc., Schaumburg, Ill.

[21] Appl. No.: 563,245

[22] Filed: Nov. 28, 1995

Related U.S. Application Data

[63] Continuation of Ser. No. 316,053, Sep. 30, 1994, abandoned, which is a continuation of Ser. No. 993,345, Dec. 18, 1992, abandoned.

[51] Int. Cl.⁶ .................. G11C 8/00; G06F 19/00
[52] U.S. Cl. ........................ 365/226; 364/431.12
[58] Field of Search ...................... 365/226, 201; 371/66, 21.1, 10.2; 395/750; 364/431.12, 707

[56] References Cited

U.S. PATENT DOCUMENTS

| 4,171,539 | 10/1979 | Tawfik | 395/750 |
| 4,868,832 | 9/1989 | Marrington | 371/66 |
| 4,908,799 | 3/1990 | Gaudronneau | 365/241 |
| 4,962,484 | 10/1990 | Takeshima | 365/226 |
| 5,070,481 | 12/1991 | Haubner | 365/226 |
| 5,095,228 | 3/1992 | Galbraith | 365/226 |
| 5,157,629 | 10/1992 | Sato | 365/201 |
| 5,223,748 | 6/1993 | Mumper | 371/66 |
| 5,285,452 | 2/1994 | Wee | 371/66 |

FOREIGN PATENT DOCUMENTS

| 53-63936 | 6/1978 | Japan | 371/66 |
| 54-51334 | 4/1979 | Japan | 371/66 |
| 0124641 | 9/1979 | Japan | 371/66 |
| 0125932 | 9/1979 | Japan | 371/66 |
| 0113495 | 7/1982 | Japan | 371/66 |
| 63-1229 | 1/1988 | Japan | 371/66 |
| 736178 | 11/1977 | U.S.S.R. | 371/66 |

*Primary Examiner*—William L. Sikes
*Assistant Examiner*—Tiep H. Nguyen
*Attorney, Agent, or Firm*—John J. King; Kenneth W. Bolvin

[57] ABSTRACT

An analog switch (100) isolates a microprocessor (120) from potentially damaging programming voltages input to a PROM (110). The microprocessor (120) controls the switch (100) to allow a lower, status voltage to be input to the microprocessor (120). When the PROM (110) is to be programmed, the microprocessor (120) opens the switch (100) to isolate the microprocessor (120) and allow the 12 VDC to only be coupled to the PROM (110).

4 Claims, 2 Drawing Sheets

MULTIPLEXED PROGRAMMING VOLTAGE AND STATUS OVER SINGLE CONDUCTOR

This is a continuation of application Ser. No. 08/316,053, filed Sep. 30, 1994 and now abandoned, which is a continuation of application Ser. No. 07/993,345, Dec. 18, 1992 and now abandoned.

FIELD OF THE INVENTION

The present invention relates generally to the field of electronics and particularly to multiplexing signals.

BACKGROUND OF THE INVENTION

CMOS integrated circuits typically require low voltages for operation. These voltages are usually in the 3–5 VDC range. Higher voltages may damage parts designed for lower voltages.

Programmable read only memory, such as flash PROMs, typically require programming voltages that are higher than its power supply voltage. These programming voltages are applied for a short time to program data into the part, then removed for normal memory read operations. In order to combine both CMOS parts and parts using lower voltages on a printed circuit board, separate conductors for the different voltages is required.

As electronic devices are reduced in size, the printed circuit boards must accommodate both conductors and parts in a much smaller area. The fewer conductors needed, therefore, the less congested a printed circuit board will be. There is a resulting need to multiplex higher voltages on the same conductors as the lower voltages.

SUMMARY OF THE INVENTION

The present invention encompasses an apparatus for multiplexing an adapter status and memory programming voltage over a conductor. The apparatus is comprised of programmable memory coupled to the conductor. The memory requires the memory programming voltage in order to be programmed. Means for switching is coupled to the conductor. The means for switching having a closed, adapter status state and an open, memory programming state. Means for generating a control signal is coupled to the means for switching. The means for switching changes states in response to the control signal.

DETAILED DESCRIPTION OF THE PREFERRED EMBODIMENT

Figure 1:
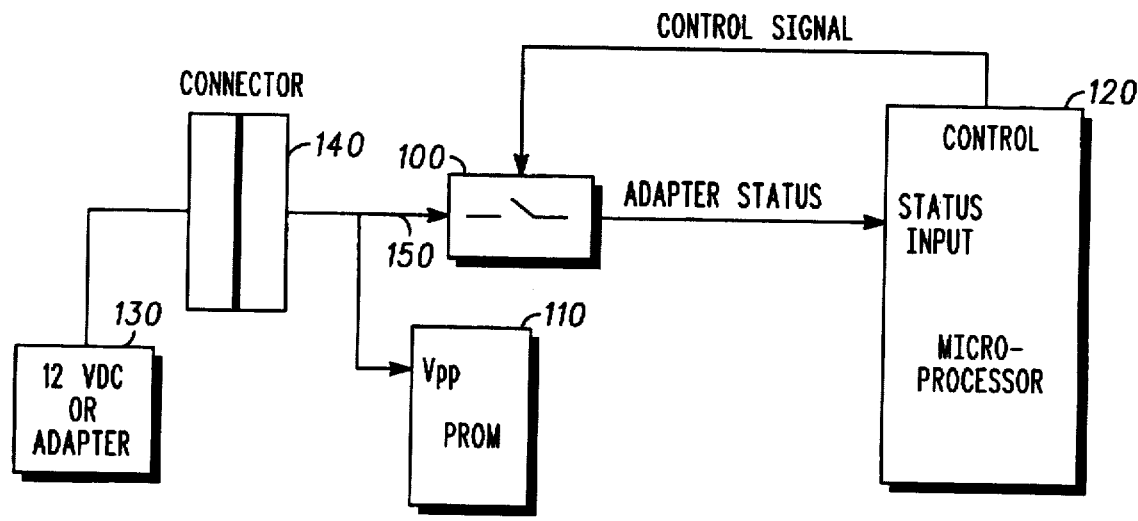
FIG. 1 illustrates the apparatus of the present invention.

The adapter status and memory programming voltage multiplexing apparatus of the present invention is illustrated in FIG. 1. The apparatus uses an analog switch (100) to connect the status sense line (150) to the microprocessor (120) in a first, sense state and disconnect from the microprocessor (120) in a second, memory programming state.

The microprocessor (120) of the present invention is constructed with CMOS technology and therefore requires input voltages less than 7 VDC. The PROM (110), in the preferred embodiment, requires 12 VDC to be programmed. This high of a voltage on the microprocessor's input lines would damage the microprocessor (120).

The analog switch (100) connects an input programming voltage/status conductor (150) to the microprocessor (120). This conductor (150), in the preferred embodiment, connects to an interface connector (140) allowing the apparatus to be coupled to external electronic devices. The conductor (150) is also connected to the programming voltage input of the PROM (110).

A control input of the analog switch (100) is coupled to the microprocessor (120). This enables the microprocessor (120) to control the state of the analog switch (100) by a control signal generated by the microprocessor (120). In the preferred embodiment, this control signal is a 0 V, logic low to open the switch and a 5 V, logic high to close the switch (100).

In the preferred embodiment, the apparatus of the present invention is included in a radiotelephone. The connector (140) of the present invention can then be connected to adapters (130) to interface the radiotelephone to modems, battery chargers, etc. The connector (140) can also be connected to a power supply (130) to generate the 12 VDC needed to program the PROM (110).

When an adapter is present on the connector (140), the microprocessor (120) closes the switch (100), thus connecting the interface connector (140) to the microprocessor (120) through the conductor (150). In the preferred embodiment, the adaptor grounds the connector (140) input thus inputting 0 V to the microprocessor (120). The microprocessor (120), therefore, looks for the 0 V to determine if the adapter is present. If the conductor is floating, the microprocessor (120) knows that an adapter is not present. The PROM (110) will remain in the read only mode when the programming voltage is between 0 V and $V_{cc}$. The PROM (110), therefore, does not have to be isolated from the conductor (150).

When the PROM (110) is to be programmed, the microprocessor (120) opens the switch (100) to isolate the microprocessor (120) from the 12 VDC programming voltage. Once the switch is open, the 12 VDC is only input to the programming voltage input of the PROM (110).

Figure 2:
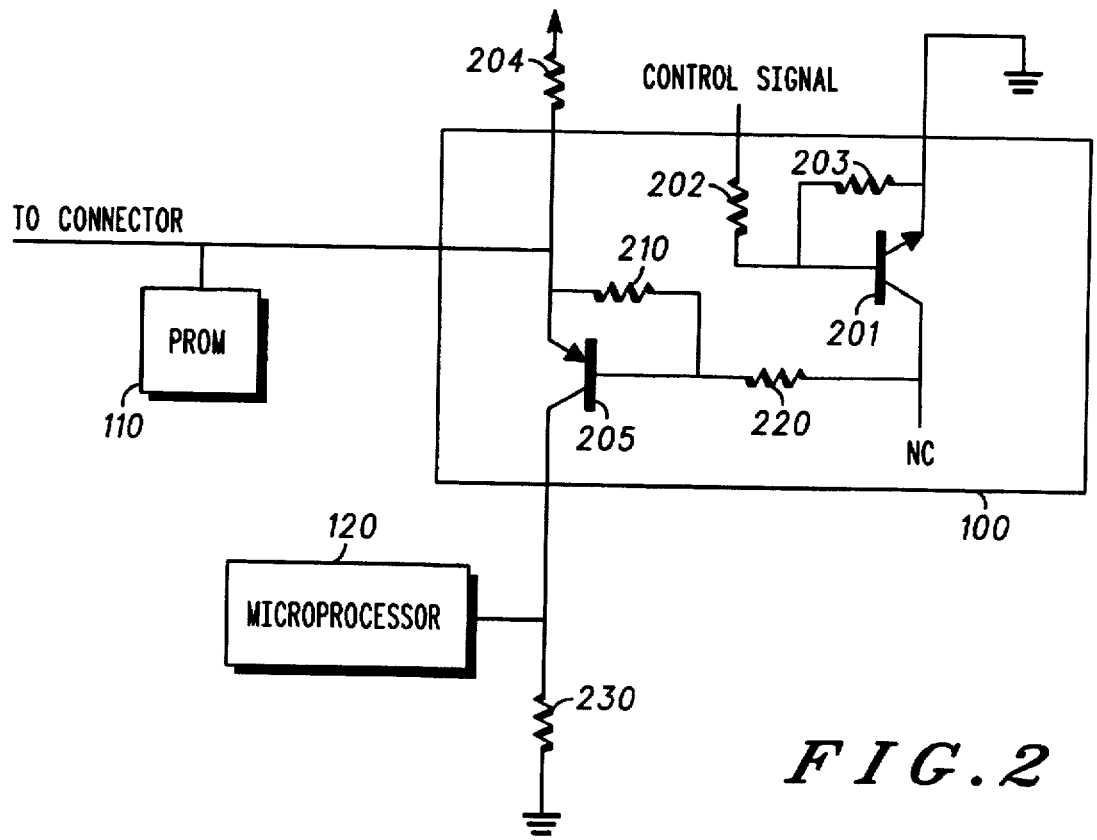
FIG. 2 illustrates the switch of the present invention.

The preferred embodiment of the analog switch (100) of the present invention is illustrated in greater detail in FIG. 2. The switch (100) is comprised of an NPN transistor (201) with its base coupled to the control signal input through a resistor (202). A resistor (203) connects the base to the emitter which is connected to ground. A PNP transistor (205) has its emitter connected to the conductor and the PROM. A resistor (204) pulls the emitter to 5 V. The emitter of the PNP transistor (205) is also connected to the base through another resistor (210). The base of this transistor (205) is coupled to the collector of the NPN transistor (201) through another resistor (220). The collector of the PNP transistor (205) is connected to the input of the microprocessor and is also coupled to ground through a resistor (230).

In operation, microprocessor inputs a logic low to the the base of the NPN transistor (201). This turns off the transistor (201) which turns off the PNP transistor (205). If the PNP transistor (205) is not conducting, there is effectively an open circuit between the conductor and the microprocessor. When the microprocessor inputs a logic high to the base of the NPN transistor (201), this transistor is turned on which turns on the PNP transistor (205) effectively coupling the conductor to the microprocessor input.

Figure 3:
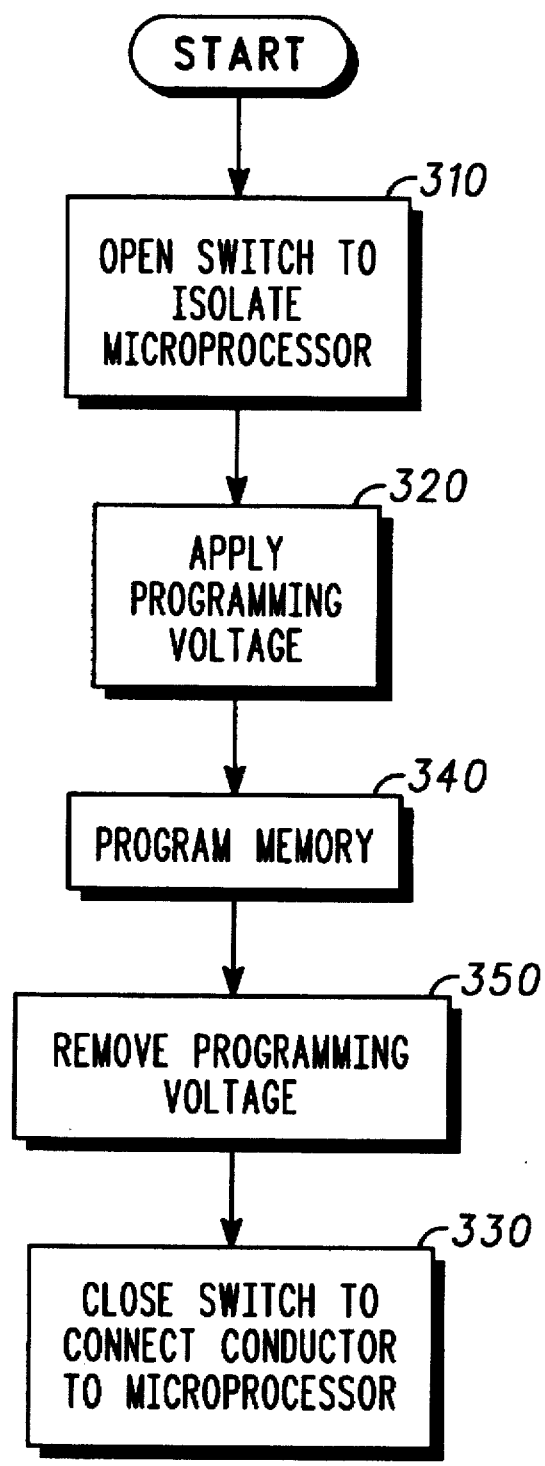
FIG. 3 illustrates a flowchart of the method of the present invention.

The method of the present invention is illustrated in FIG. 3. The method begins by opening the switch using the program memory control signal from the microprocessor (310). The 12 VDC programming voltage is then applied to program the memory (320). The memory is programmed (340) and the programming voltage is removed (350). The microprocessor then generates the adapter get status signal to close the switch, thus allowing the microprocessor to sense if an adapter is present (330).

By using the present invention, a CMOS integrated circuit that would be damaged by a high voltage can be isolated from that voltage. The same conductor used to carry the high voltage can then be used at a different time to input a lower voltage to the CMOS part. The present invention, therefore, enables a single conductor to be used for multiple functions.

We claim:

1. An electronic device having circuitry for receiving a first voltage and circuitry for receiving a second voltage, the electronic device comprising:

an external connector having a plurality of conductors, said external connector being adapted to receive an external input signal having said first voltage or said second voltage from an external adapter;

programmable memory coupled to a single conductor of said plurality of conductors, the memory requiring said second voltage in order to be programmed;

means for multiplexing voltages coupled to the single conductor, the means for multiplexing having a closed, adapter status state for coupling said first voltage to said circuitry for receiving said first voltage and an open, memory programming state for coupling said second voltage to said programmable memory; and means for generating a control signal coupled to the means for multiplexing, the means for multiplexing changing states in response to the control signal.

2. The apparatus of claim 1 wherein the second voltage is 12 VDC.

3. The apparatus of claim 1 wherein the means for switching voltages is comprised of a first transistor coupled to a second transistor.

4. The apparatus of claim 1 wherein the means for generating a control signal is a microprocessor.

* * * * *